(12) United States Patent
Peeters et al.

(10) Patent No.: US 7,308,589 B2
(45) Date of Patent: Dec. 11, 2007

(54) CONTROLLING POWER CONSUMPTION PEAKS IN ELECTRONIC CIRCUITS

(75) Inventors: Adrianus Marinus Gerardus Peeters, Eindhoven (NL); Daniel Timmermans, Eindhoven (NL); Mark Nadim Olivier De Clercq, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/578,641

(22) PCT Filed: Nov. 3, 2004

(86) PCT No.: PCT/IB2004/052275

§ 371 (c)(1),
(2), (4) Date: May 9, 2006

(87) PCT Pub. No.: WO2005/048264

PCT Pub. Date: May 26, 2005

(65) Prior Publication Data

US 2007/0083773 A1    Apr. 12, 2007

(30) Foreign Application Priority Data

Nov. 12, 2003    (EP) .................................. 03104162

(51) Int. Cl.
*G06F 1/00* (2006.01)
(52) U.S. Cl. ........................ 713/322; 713/320; 713/401

(58) Field of Classification Search ................ 713/401, 713/322, 320
See application file for complete search history.

(56) References Cited

U.S. PATENT DOCUMENTS

| | | | | |
|---|---|---|---|---|
| 4,980,851 A * | 12/1990 | Komori et al. | ............. | 713/320 |
| 5,349,612 A * | 9/1994 | Guo et al. | .................. | 375/371 |
| 5,565,798 A * | 10/1996 | Durham et al. | ................ | 326/93 |
| 5,737,614 A * | 4/1998 | Durham et al. | ............. | 713/322 |
| 6,037,801 A * | 3/2000 | Zhu | ............................ | 326/46 |
| 6,064,232 A * | 5/2000 | Relph | ........................... | 326/93 |
| 6,134,688 A * | 10/2000 | Sachdev | ..................... | 714/727 |
| 6,577,551 B2 * | 6/2003 | Ito et al. | ................... | 365/225.7 |
| 6,788,110 B2 * | 9/2004 | Endo | ........................... | 326/93 |
| 2002/0108068 A1 * | 8/2002 | Coenen | ...................... | 713/322 |
| 2003/0042795 A1 * | 3/2003 | Veendrick et al. | ............ | 307/38 |
| 2003/0079150 A1 * | 4/2003 | Smith et al. | ................ | 713/320 |
| 2004/0068684 A1 * | 4/2004 | Huang et al. | ................ | 714/718 |

* cited by examiner

*Primary Examiner*—Chun Cao
*Assistant Examiner*—Vincent T Tran

(57) ABSTRACT

An electronic circuit is provided that comprises a plurality of storage elements (101-105) arranged for storing of data elements, and a plurality of processing elements. The plurality of processing elements processes the data elements stored in the storage elements. In operation, the points in time at which respective storage elements load their data elements are mutually different in order to meet a maximum allowable value of the power consumption peaks.

14 Claims, 5 Drawing Sheets

CONTROLLING POWER CONSUMPTION PEAKS IN ELECTRONIC CIRCUITS

TECHNICAL FIELD

The invention relates to an electronic circuit for processing data elements, as well as a method for processing data elements.

BACKGROUND ART

Maximizing the amount of parallelism is a conventional technique to increase the performance of an electronic circuit. An electronic circuit performs logic operation on data that is stored in a storage element and produces data that is output to the outside world, or stored in the same or a different storage element. By storing data in several storage elements in parallel, under the constraint that no data-dependency relation exists, processing of these input values can be started in parallel as well.

Such electronic circuits exhibit power consumption peaks when data is stored in a number of storage elements in parallel, and the more storage elements are activated in parallel, the higher the power consumption peak is. A power consumption peak is not only exhibited by the activation of the storage elements, but also by the distribution of the signal to activate the storage elements as well as by the induced effect of the values of the output data changing. These peaks in power consumption may not be affordable in certain applications. For example, in case of mixed signal circuits, where analog or radio frequency elements are integrated near electronic circuits, bouncing of the power supply must be controlled. In case of electronic circuits applied in smart cards, the power consumption peak must be controllable as well, especially during contactless operation in order to control the level of electromagnetic emission.

It is an object of the invention to control the power consumption peaks in electronic circuits.

This object is achieved with an electronic circuit comprising a plurality of storage elements arranged for storing of data elements, and a plurality of processing elements arranged for processing data elements stored in the plurality of storage elements. The storage elements of the plurality of storage elements are further arranged to load their data elements at respective points in time of a first set of points in time, and wherein the points in time are mutually different in order to meet a maximum allowable value of the power consumption peaks. By differing these points in time of respective storage elements, these storage elements are sequentially activated. The corresponding logic circuitry for processing the data elements is therefore sequentially activated as well. By varying the difference in points in time such that a maximum allowable value for the peak in power consumption is not exceeded, the power consumption peaks in electronic circuits are controlled. Furthermore, the voltage of the power supply does not have to be reduced in order to control the power consumption peaks. The invention can be applied for both synchronous electronic circuits as well as for asynchronous electronic circuits. The maximum allowable value in the power consumption peaks depends, amongst others, on the type of electronic circuit and the application of the circuit.

A synchronous electronic circuit for processing data elements is described in an article by Ashok Vittal et al, titled "Clock Skew Optimization for Ground Bounce Control", Proc. International Conf. Computer-Aided Design (IC-CAD), pages 395-399, 1996. Vittal et al describe an approach to reduce the amount of ground bounce in a synchronous circuit. Given a target clock frequency, the amount of ground bounce is minimized, that is, the higher current peaks are lowered as much as possible. It is based on sub-dividing the synchronous clocking into multiple sub-clocks with relative skew, where feasible. This spreads the computation across a large part of the clock cycle instead of largely occuring at the beginning. Their method allows to distribute a single clock that is skewed where possible, so as to make the circuit activity appear more asynchronous, and thus to reduce the power consumption peaks, but all within the timing constraints that still have to be met. Their article does not disclose how to achieve a specified target for the maximum power consumption peaks, i.e. the ground bounce, and then to maximize the performance of the circuit under this condition.

U.S. Pat. No. 6,262,612 describes a digital circuit for processing data stored in storage elements. The storage elements are clocked using a common clock signal, and the clock signal is delayed with a different value for different storage elements. As a result, the supply current peaks are reduced. However, it does not disclose how to achieve a specified target for the maximum power consumption peaks.

U.S. Pat. No. 6,363,007 discloses a method for writing magneto-resistive memory devices to help reduce peak currents during a write. The magneto-resistive memory device has a number of magneto-resistive bits organized into a number of words. All of the magneto-resistive bits in a word are selected by a common word line, and each magneto-resistive bit in a particular word is selected by a different digital line. To write such a memory, a selected one of the word lines is first activated to select all of the magneto-resistive bits in a desired word. Thereafter, the digital lines that correspond to selected magneto-resistive bits in the desired word are sequentially activated. Because the digital lines are sequentially activated, rather than activated in parallel, the peak currents experienced during write operation are reduced. Using this method, a set of bits can be written sequentially to the magneto-resistive memory. However, this document does not disclose a method for the sequential activation of circuit based storage elements, such as flip-flops or latches. It does also not disclose the sequential storage of data blocks having arbitrary number of bits in a memory. Finally, in the document the problem of non-controllable power consumption peaks in relation to the application of a memory or electronic circuit is not discussed.

An embodiment of the invention is characterized in that the electronic circuit further comprises a clock generator arranged to generate periodic clock signals, and delay elements arranged to generate a point in time of the first set for a respective one of the storage elements by adding respective delays to a source clock signal, wherein the respective delays are mutually different, and wherein the frequency of the clock generator is low enough in order to ensure data integrity during processing of the data elements. In general, a synchronous electronic circuit allows to obtain a high performance by optimizing the timing behaviour of the circuit. However, by storing data elements in the storage elements in parallel, the resulting power consumption peaks may be too high for a particular application. By applying the proper delays to the clock signal, the power consumption peaks can be controlled. The clock frequency is kept low enough in order to ensure data integrity during operation of the electronic circuit. However, the loss in performance is outweighed by the reduction in the power consumption peaks below a maximum allowable value.

An embodiment of the invention is characterized in that the electronic circuit further comprises a timing circuit arranged to determine the first set of points in time in a first operating mode, wherein the timing circuit is further arranged to determine a second set of points in time, in a second operating mode, at which respective storage elements of the plurality of storage elements load their data elements, wherein the respective points in time of the second set of points in time are essentially identical, and wherein the timing circuit is further arranged to select an operating mode depending on a control signal. Using the control signal, the storage elements can be activated either in parallel or sequentially, allowing to use the trade off between controlling the power consumption peaks and maximizing the performance of an electronic circuit.

An embodiment of the invention is characterized in that the timing circuit comprises a first clock generator arranged to generate periodic clock signals, each to determine the respective points in time of the first set of points in time, and wherein the timing circuit further comprises a second clock generator arranged to generate periodic clock signals, each to determine the respective points in time of the second set of points in time. Using two different clocks is a relatively simple way to generate the two sets of points in time in a synchronous circuit. The frequency of the second clock generator may be reduced, compared to the frequency of the first clock generator, in order to ensure data integrity during operation of the electronic circuit.

An embodiment of the invention is characterized in that the electronic circuit further comprises delay elements arranged to generate a point in time of the first set for a respective one of the storage elements by adding respective delays to a source clock signal, wherein the respective delays are mutually different. Delaying the clock signal is a relatively simple way of generating different points in time in a synchronous circuit.

An embodiment of the invention is characterized in that the timing circuit comprises a clock generator arranged to generate periodic clock signals, each to determine the respective points in time of either the first set of points in time or the second set of points in time, depending on the control signal. An advantage of this embodiment is that only one clock generator is required, for generating either the points in time of the first set or the second set.

An embodiment of the invention is characterized in that the electronic circuit is a self-timed circuit, further comprising a handshake channel arranged for communication between storage elements of the plurality of storage elements and processing elements of the plurality of processing elements, and delay elements arranged to generate a point in time of the first set for a respective one of the storage elements by adding respective delays to a request signal for loading of the data elements, wherein the delays are mutually different. Delaying the request signal is a relatively simple way of implementing mutually different points in time for the storage elements. An advantage of self-timed circuits is that data are exchanged using a handshake to indicate the validity and acceptance of data, in general resulting in lower power consumption when compared to synchronous electronic circuits.

An embodiment of the invention is characterized in that the electronic circuit is a self-timed circuit, further comprising handshake channels arranged for communication between storage elements of the plurality of storage elements and processing elements of the plurality of processing elements, and a first handshake component arranged to receive a request signal, in a first operating mode, for loading of data elements and in response thereto to generate a request signal for a respective one of the storage elements of the plurality of storage elements for loading of data elements at respective points in time of the first set of points in time. An advantage of this embodiment is that a single handshake component allows to sequentially activate several storage elements.

An embodiment of the invention is characterized in that the electronic circuit further comprises a second handshake component arranged to receive a request signal, in a second operating mode, for loading of data elements and in response thereto to generate a request signal for a respective one of the storage elements of the plurality of storage elements for loading of data elements, wherein the request signals are generated at essentially identical points in time, and wherein the electronic circuit is further arranged to select an operating mode depending on a control signal. Using the control signal, the storage elements can be activated either in parallel or sequentially, allowing to use the trade off between reducing the power consumption peaks and increasing the performance of a self-timed electronic circuit.

According to the invention, a method of processing data elements comprises: determining a first set of points in time, in a first operating mode, for storing data elements in respective storage elements of a plurality of storage elements, and generating output data elements each by performing respective logic operation on respective data elements, wherein the points in time of the first set of points in time at which respective storage elements load their data elements are mutually different in order to meet a maximum allowable value of the power consumption peaks. Power consumption peaks are controlled as a result of the sequential activation of the storage elements. An eventual loss in performance is acceptable and outweighed by the reduction of the power consumption peaks below a maximum allowable value.

An embodiment of the invention is characterized in that the method further comprises: determining a second set of points in time, in a second operating mode, for storing data elements in respective storage elements of the plurality of storage elements, wherein the points in time of the second set of points in time at which respective storage elements load their data elements are essentially identical, and selecting an operating mode, depending on a control signal. An advantage of this embodiment is that it allows to use the trade off between controlling the power consumption peaks and maximizing the performance of an electronic circuit.

DESCRIPTION OF EMBODIMENTS

Figure 1:
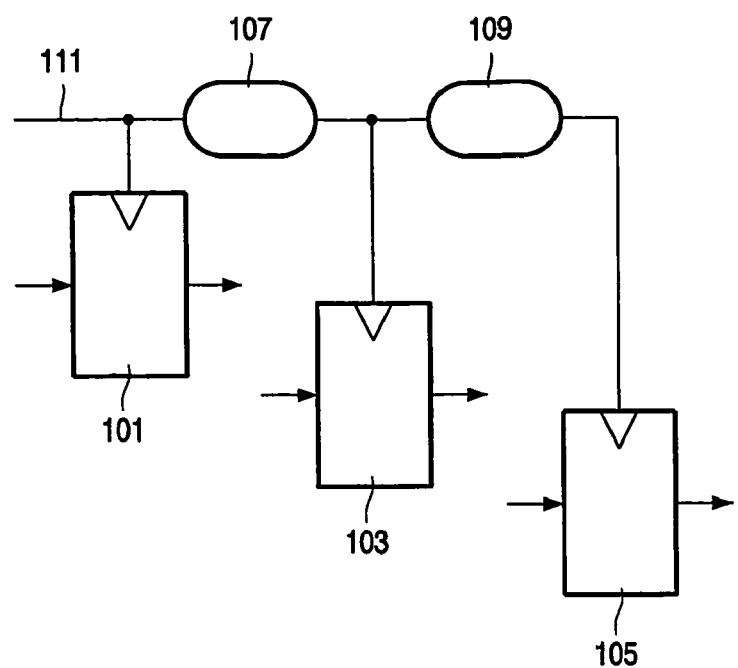
FIG. 1 shows a synchronous electronic circuit according to the invention.

FIG. 1 shows an electronic circuit according to the invention, including storage elements 101, 103 and 105, and delay elements 107 and 109. The electronic circuit also comprises processing elements, not shown in FIG. 1, for processing of the data elements stored in storage elements 101-105, as well as a clock, not shown in FIG. 1 as well, which generates a periodic clock signal 111. The electronic circuit may also comprise further storage elements, or processing elements, depending on the application of the electronic circuit, amongst others. In operation, the electronic circuit performs logic operation on input data, applied to the input of the electronic circuit, not shown in FIG. 1, and produces output data. Any kind of logic operation can be realized, using for example NAND gates, NOR gates, inverters, amongst others, not shown in FIG. 1. In operation, the clock produces a periodic clock signal 111 that is used to generate a point in time for each of the respective storage elements 101-105, i.e. to activate each of the storage elements 101-105 for storing data elements. The storage elements 101-105 can be latches, i.e. known circuits that pass data elements from their inputs to their outputs when the clock signal has first value and hold the output data when the clock signal has a second value. Alternatively, different circuits such as flip-flops can be applied, that load data on an edge of a clock pulse. Upon a clock signal 111, the storage element 101 stores a data element and supplies this to a processing element, as indicated by the arrows. Delay element 107 delays the clock signal 111 such that storage element 103 receives the clock signal 111 at a later moment in time than storage element 101. Upon the delayed clock signal 111, the storage element 103 stores a data element and supplies this to a processing element. Delay element 109 further delays the clock signal 111 such that storage element 105 receives the clock signal 111 at a later moment in time than storage element 103. Upon the further delayed clock signal 111, the storage element 105 stores a data element and supplies this to a processing element. The value of the delays introduced by delay elements 107 and 109 are identical, but in alternative embodiments the value of the delays is different. The delay elements 107 and 109 may comprise, for example, a series of inverters, which delays the clock signal. The frequency of the clock is low enough in order to take the respective delays added to the clock signal 111 into account and to ensure data integrity during data processing. In case, for example, output data from the processing element corresponding to storage element 105 is used as input data for the processing element corresponding to storage element 101, the processing element corresponding to storage element 105 should finish its processing for a given clock cycle before a next clock signal is received by storage element 101. By applying the proper delays, implemented by the delay elements 107 and 109, to the clock signal 111, the peaks in the power consumption of the electronic circuit can be controlled and maintained below a maximum allowable value. The frequency of the clock is just low enough to take the respective delays into account, but at the same time maximizing the performance of the electronic circuit, given these constraints.

Figure 2:
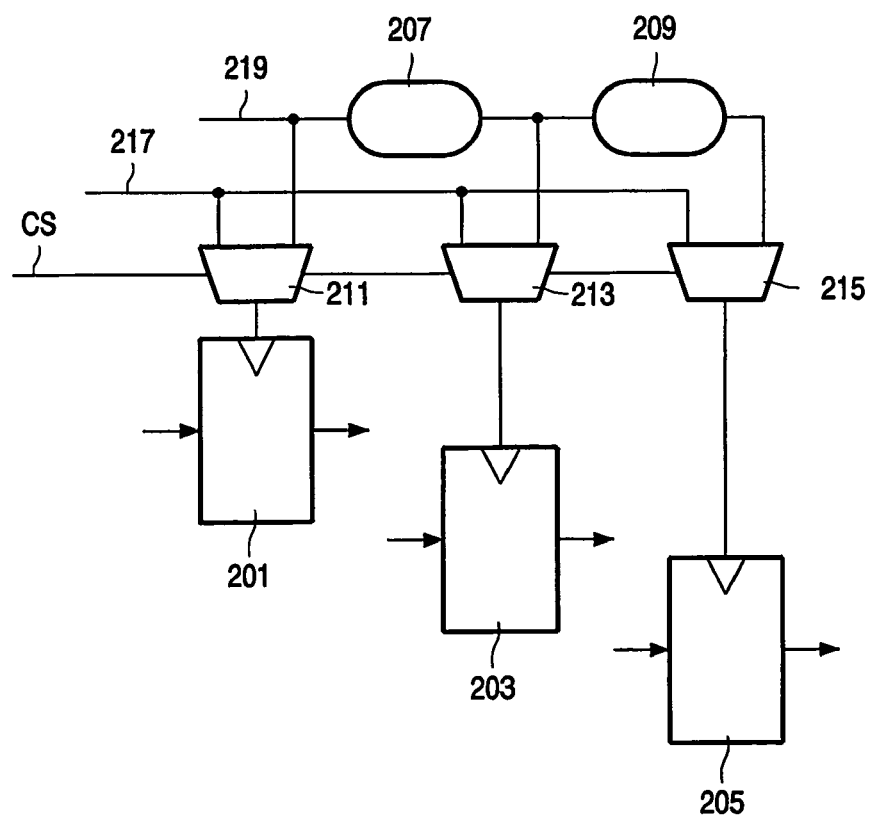
FIG. 2 shows a further synchronous electronic circuit according to the invention.

FIG. 2 shows an electronic circuit according to the invention, including storage elements 201, 203 and 205, delay elements 207 and 209, and multiplexers 211, 213 and 215. The electronic circuit also comprises processing elements, not shown in FIG. 2, for processing of the data elements stored in storage elements 201-205, as well as two clocks, not shown in FIG. 2 as well, which generate periodic clock signals 217 and 219. The electronic circuit may also comprise further storage elements, or processing elements, depending on the application of the electronic circuit, amongst others. In operation, the electronic circuit performs logic operation on input data, applied to the input of the electronic circuit, not shown in FIG. 2, and produces output data. In operation, the first clock produces a first periodic clock signal 219 that is used to generate a first set of points in time for loading of data elements for the respective storage elements 201-205, and the second clock produces a second periodic clock signal 217 that is used to generate a second set of points in time for loading of data elements for the respective storage elements 201-205. A control signal CS is applied to the multiplexers 211-215 for selecting either the clock signal 219, in case the control signal CS is equal to zero in this embodiment, or the clock signal 217, in case the control signal CS is equal to one in this embodiment. The storage elements 201-205 can be latches, or alternatively different circuits such as flip-flops can be applied. In case the control signal CS is equal to zero, the clock signal 219 is selected by the storage elements 201-205 via the multiplexers 211-215. Upon a clock signal 219, the storage element 201 stores a data element and supplies this to a processing element, as indicated by the arrows. Delay element 207 delays the clock signal 219 such that storage element 203 receives the clock signal 219 at a later moment in time than storage element 201. Upon the delayed clock signal 219, the storage element 203 stores a data element and supplies this to a processing element. Delay element 209 further delays the clock signal 219 such that storage element 205 receives the clock signal 219 at a later moment in time than storage element 203. Upon the further delayed clock signal 219, the storage element 205 stores a data element and supplies this to a processing element. In case the control signal CS is equal to one, the clock signal 217 is selected by the storage elements 201-205 via the multiplexers 211-215. Upon a clock signal 217, the storage elements 201-205 receive this signal simultaneously, store their respective data elements and supply these to a respective processing element in parallel. The frequency of the first clock is lower than the frequency of the second clock in order to ensure data integrity during operation of the electronic circuit. In alternative embodiments, the frequency of the first clock is equal to that of the second clock, while still ensuring data integrity during operation of the electronic circuit. Depending on the control signal CS, the storage elements can be activated in parallel, maximizing the performance of the electronic circuit, or sequentially in order to maintain the power consumption peaks below a maximum allowable value. As a result, the trade-off between maximizing performance and controlling power consumption peaks can be exploited. The frequency of the first clock generator is just low enough to take the respective delays into account, at the same time maximing the performance of the electronic circuit under these constraints.

Referring to both FIG. 1 and FIG. 2, the delays implemented by the delay elements 107, 109, 207 and 209 are determined during design of the electronic circuit. Given a range of applications to be implemented by the electronic circuit, the delays required to meet the maximum allowable value in the power consumption peaks can be calculated, and implemented by the delay elements. The frequency of the clock for generating clock signals 111 and 219 can be determined as well during design, and implemented by the clock. Alternatively, the electronic circuit may comprise a dedicated circuit, which measures the peaks in the power consumption and compares these values with a predetermined maximum allowable value. In response to the results of this comparison, the dedicated circuit determines the delays of the delay elements, required for meeting the maximum allowable value of the power consumption peaks, as well as the frequency of the clock for generating clock signals 111 and 219, and controls the delay elements and clock to implement these values, respectively.

Figure 3:
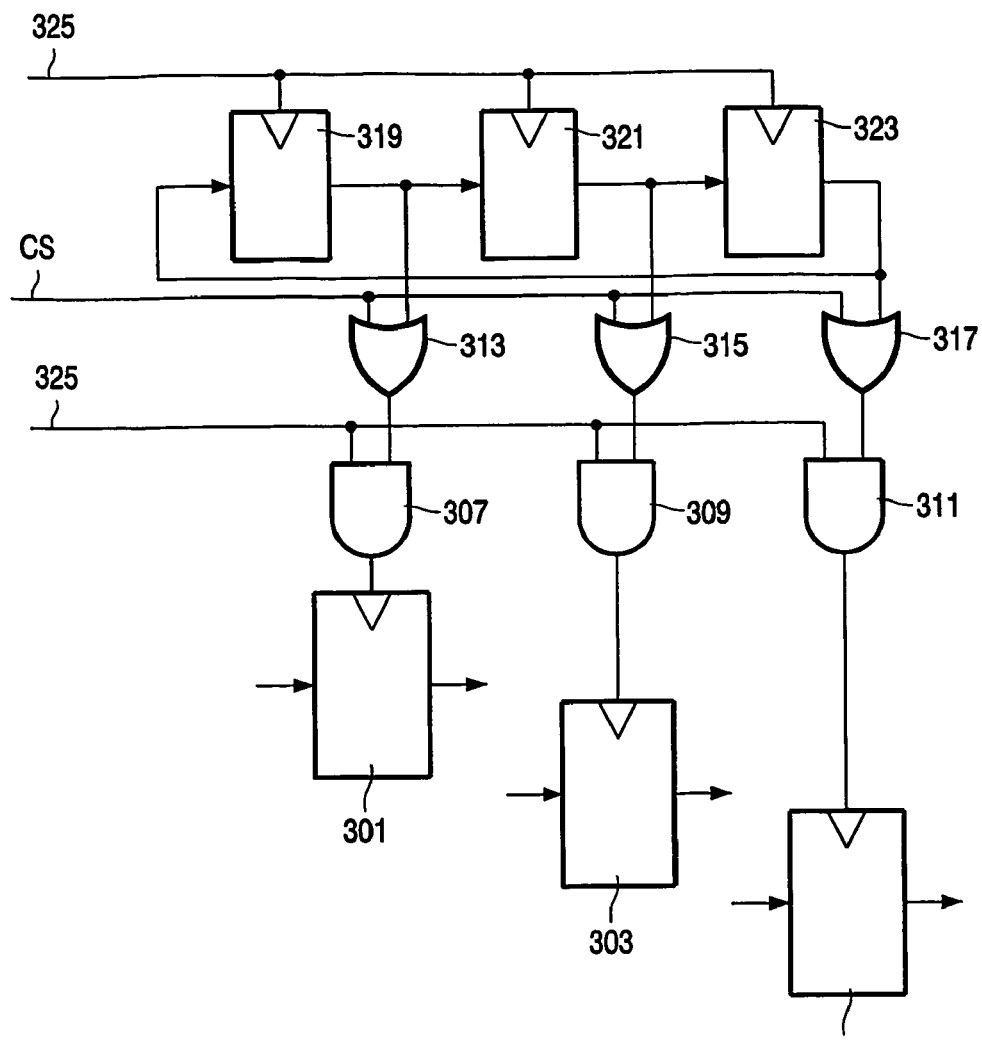
FIG. 3 shows an alternative further synchronous electronic circuit according to the invention.

FIG. 3 shows an electronic circuit according to the invention, including storage elements 301, 303 and 305, AND gates 307, 309 and 311, OR gates 313, 315 and 317 and flip-flops 319, 321 and 323. The electronic circuit also comprises processing elements, not shown in FIG. 3, for processing of the data elements stored in storage elements 301-305, and a clock, not shown in FIG. 3 as well, which generates a periodic clock signal 325. The electronic circuit may also comprise further storage elements, or processing elements, depending on the application of the electronic circuit, amongst others. In operation, the electronic circuit performs logic operation on input data, applied to the input of the electronic circuit, not shown in FIG. 3, and produces output data. In operation, the clock produces a periodic clock signal 325 that is both applied to the AND gates 307-311 and to the flip-flops 319-323, for generating a set of points in time for the respective storage elements 301-305. A control signal CS is applied to the OR gates 313-317. In case the control signal CS is equal to one, the OR gates 313-317 output a value equal to one, independent of the values stored in flip-flops 319-323, and the clock signal 325 is distributed to all the storage elements 301-305 simultaneously. Upon a clock signal 325, the storage elements 301-305 receive this signal, store their respective data elements and supply these to a respective processing element in parallel, as indicated by the arrows. In case the control signal CS is equal to zero, the distribution of the clock signal is under control of the flip-flops 319-323. Initially, flip-flop 319 stores a bit value equal to one, and flip-flops 321-323 store a value equal to zero. OR gate 313 outputs a value equal to one, while OR gates 315 and 317 output a value equal to zero. Upon a clock signal 325, the clock signal is only distributed to storage element 301, and storage element 301 stores a data element and supplies this to a processing element, as indicated by the arrows. Upon the clock signal 325 the flip-flops 319-323 supply the stored bit value to their successor, where flip-flop 319 receives the bit value stored in flip-flop 323. As a result, in the next clock cycle flip-flop 321 stores a bit value equal to one, and flip-flops 319 and 323 store a value equal to zero. Upon a next clock signal 325, storage element 303 stores a data element and supplies this to a processing element, and the bit value equal to one is stored in flip-flop 323. Upon another clock cycle 325, storage element 305 stores a data element and supplies this to a processing element, and the bit value equal to one is stored in flip-flop 319 again. Using a single clock, the trade-off between maximizing the performance and controlling the power consumption peaks can be exploited. During the latter, the frequency of the clock does not have to be lowered, in principle, to ensure data integrity, since a processing element always has at least one full clock cycle to finish its operation and before its output data is clocked into a storage element, for example. The frequency of the clock required for controlling the power consumption peaks can be determined during design of the electronic circuit.

Figure 4:
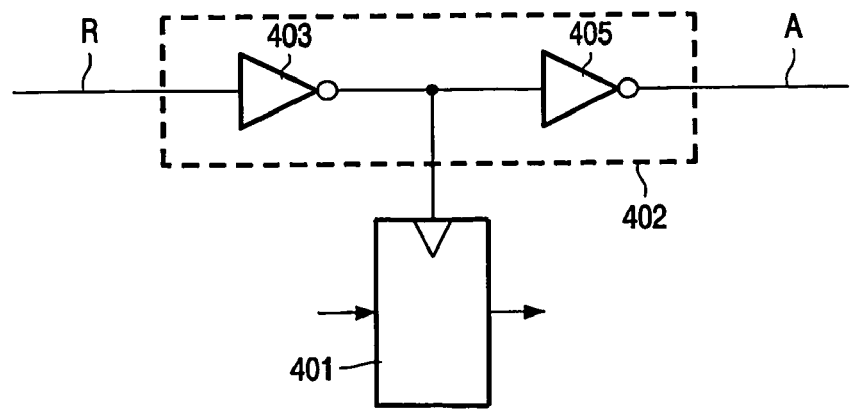
FIG. 4 shows a storage element coupled to a controller circuit.

FIG. 4 shows a storage element 401 coupled to a controller circuit 402. The controller circuit 402 comprises inverters 403 and 405. The storage element 401 is a positive edge triggered flip-flop. The controller circuit 402 is coupled to a handshake channel formed by request signal R and acknowledge signal A. The handshake channel is based on a four-phase handshake protocol. In operation, the request signal R goes high, and the inverter 403 receives this request signal for storing a data element in storage element 401. The request signal R is inverted by inverter 403, and a signal equal to zero is received by the clock input of storage element 401. Inverter 405 inverts the signal and an acknowledge signal A equal to one is generated by inverter 405. The request signal R goes low, is inverted by inverter 403 and a signal equal to one is received by the clock input of storage element 401. At the rising edge of this signal, a data element is stored in storage element 401. The signal is inverted by inverter 405 and an acknowledge signal A equal to zero is generated. The storage of a data element in the storage element 401 is acknowledged by the falling edge of this acknowledge signal A.

Figure 5:
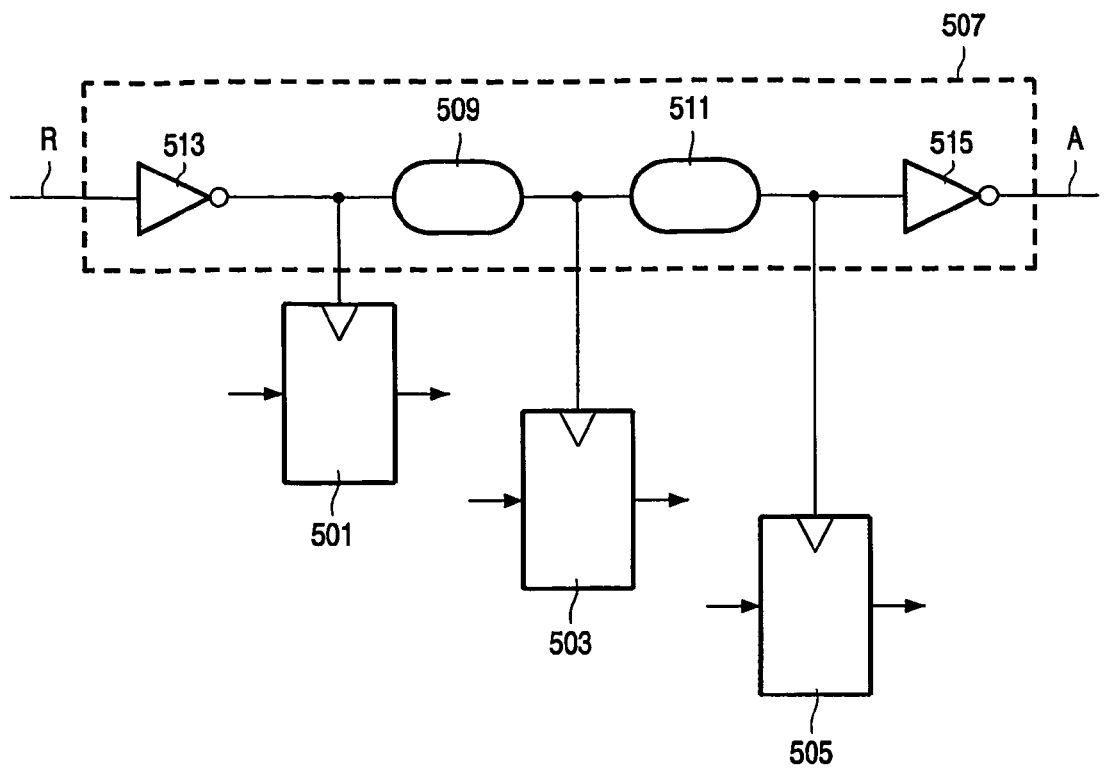
FIG. 5 shows a self-timed electronic circuit according to the invention.

FIG. 5 shows a self-timed electronic circuit according to the invention, including storage elements 501, 503 and 505 and a controller circuit 507. The controller circuit 507 comprises delay elements 509 and 511, and inverters 513 and 515. The controller circuit 507 is coupled to a handshake channel formed by request signal R and acknowledge signal A. The electronic circuit also comprises processing elements, not shown in FIG. 5, for processing of the data elements stored in storage elements 501-505. The electronic circuit may also comprise further storage elements, or processing elements, depending on the application of the electronic circuit, amongst others. In operation, the electronic circuit performs logic operation on input data, applied to the input of the electronic circuit, not shown in FIG. 5. The handshake channel is based on a four-phase handshake protocol. The signal generated by inverter 513 is delayed by delay element 509 such that storage element 503 receives the signal at a later moment in time than storage element 501. The signal is further delayed by delay element 511 such that storage element 505 receives the signal at a later moment in time than storage element 503. In operation, inverter 513 receives a request signal R for storing data elements in storage elements 501-505. Storage element 501 first stores a data element at the rising edge of the request signal and supplies this data element to a processing element, next storage element 503 stores a data element at the rising edge of the delayed request signal and supplies this data element to a processing element, and next storage element 505 stores a data element at the rising edge of the further delayed request signal and supplies this data element to a processing element. The signal is inverted by inverter 515 and an acknowledge signal A equal to zero is generated. The storage of data elements in the storage elements 501-505 is acknowledged by the falling edge of this acknowledge signal A. By choosing the proper delays implemented by the delay elements 509 and 511, the peaks in the power consumption of the electronic circuit can be controlled and maintained below a maximum allowable value, but at the same time maximizing the performance of the circuit given this constraint. The delays implemented by delay elements 509-511 can be determined during design of the electronic circuit. Alternatively, the electronic circuit may comprise a dedicated circuit which measures the peaks in the power consumption and compares these values with a predetermined maximum allowable value. In response to the results of this comparison the delays are determined, as described in the embodiments of FIGS. 1 and 2.

Figure 6:
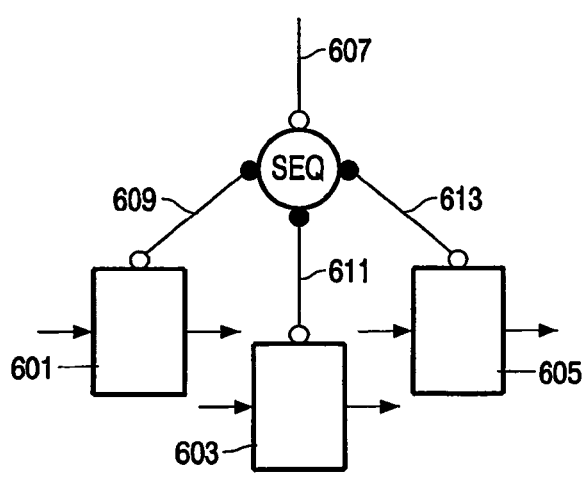
FIG. 6 shows a further self-timed electronic circuit according to the invention.

FIG. 6 shows a self-timed electronic circuit according to the invention, including storage elements 601, 603 and 605, and a handshake component SEQ. The handshake component SEQ is coupled to a handshake channel 607, and storage elements 601-605 are coupled to handshake component SEQ via handshake channel 609-613, respectively. The storage elements 601-605 abstract from the implementation shown in FIG. 4, and can contain latches or flip-flops. The open circles in this figure refer to the passive side of a handshake channel, corresponding to the acknowledge signal, while a filled circle refers to the active side of a handshake channel, corresponding to the request signal. The electronic circuit also comprises processing elements, not shown in FIG. 6, for processing of the data elements stored in storage elements 601-605. In operation, the handshake component SEQ is activated via the passive port of handshake channel 607. In reaction upon the activation, handshake component SEQ executes a handshake communication along handshake channel 609 for storing a data element in storage element 601, next a handshake communication along handshake channel 611 for storing a data element in storage element 603, and next a handshake communication along handshake channel 613 for storing a data element in storage element 605. As obvious to the person skilled in the art, different handshake protocols can be used for the communication via handshake channels 607-613, for example two-phase or four-phase, and using different data encodings, for example single-rail or dual-rail, as described by J. Sparsø and S. Furber, Principles of Asynchronous Circuit Design: A Systems Perspective, Kluwer Academic Publishers, Boston, December 2001.

Figure 7:
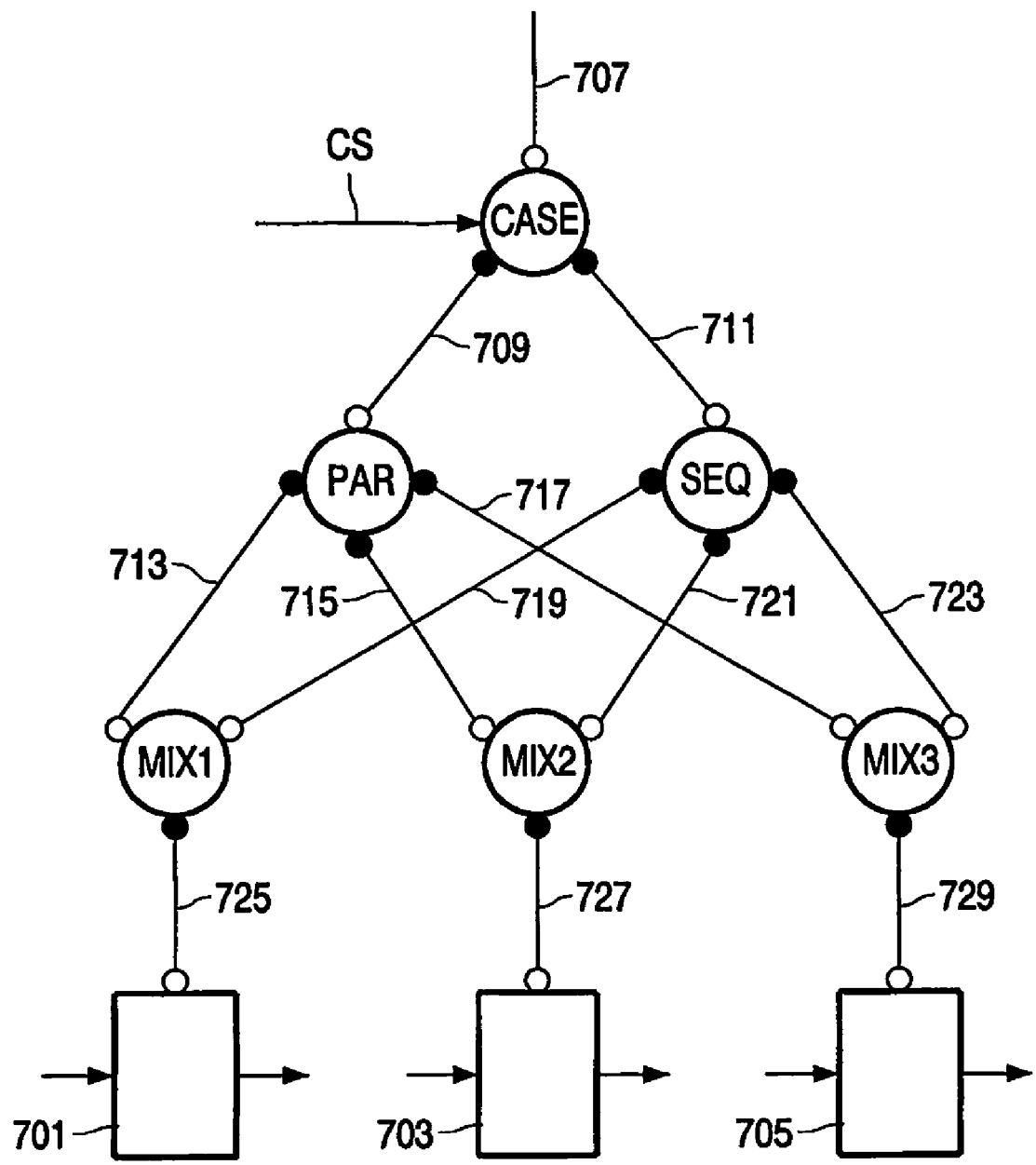
FIG. 7 shows an alternative further self-timed electronic circuit according to the invention.

FIG. 7 shows a self-timed electronic circuit according to the invention, including data storage elements 701, 703 and 705, handshake component CASE, handshake component SEQ, handshake component PAR and handshake components MIX1, MIX2 and MIX3. The handshake component CASE is coupled to handshake channel 707. Handshake components PAR and SEQ are coupled to handshake component CASE via handshake channels 709 and 711, respectively. Handshake components MIX1-MIX3 are coupled to handshake component PAR via handshake channels 713-717, respectively, and to handshake component SEQ via handshake channels 719-723, respectively. Storage elements 701-705 are coupled to a corresponding handshake component MIX1-MIX3 via handshake channels 725-729, respectively. The open circles in this figure refer to the passive side of a handshake channel, while a filled circle refers to the active side of a handshake channel. The storage elements 701-705 abstract from the implementation shown in FIG. 4, and can contain latches or flip-flops. The function of handshake components MIX1-MIX3 is to merge incoming handshakes. The electronic circuit also comprises processing elements, not shown in FIG. 7, for processing of the data elements stored in storage elements 701-705. In operation, the handshake component CASE is activated via the passive port of handshake channel 707. Depending on a control signal CS, either a handshake communication via handshake channel 709 or via handshake channel 711 is executed. In case control signal CS is equal to zero, a handshake communication via handshake channel 709 is executed, and handshake component PAR is activated. In reaction upon the activation, handshake component PAR executes three handshake communications simultaneously, via handshake channels 713-717, handshake components MIX1-MIX3 and handshake channels 725-729, respectively, for storing data elements in storage elements 701-705 in parallel. In case control signal CS is equal to one, a handshake communication via handshake channel 711 is executed, and handshake component SEQ is activated. In reaction upon the activation, handshake component SEQ executes a handshake communication via handshake channel 719. Handshake component MIX1 is activated and a handshake communication via handshake channel 725 is executed, upon which a data element is stored in storage element 701. Next, handshake communications via handshake channels 721 and 727 are executed, respectively, upon which a data element is stored in storage element 703. Next, handshake communications via handshake channels 723 and 729 are executed, respectively, upon which a data element is stored in storage element 705. By selecting the proper value of control signal CS data elements can either be stored in parallel in storage elements 701-705, or at different points in time. This embodiment allows to use the trade-off between maximing performance and controlling power consumption peaks, for self-timed circuits, using the control signal CS. Different handshake protocols can be used for the communication via handshake channels 707-729, as known by the person skilled in the art.

Referring to both FIGS. 6 and 7, the delays that handshake component SEQ implements between two successive handshake communications is determined during design of the electronic circuit. Alternatively, the electronic circuit may comprise a dedicated circuit which measures the peaks in the power consumption and compares these values with a predetermined maximum allowable value. In response to the results of this comparison the delays are determined and implemented by the handshake component SEQ.

Referring again to both FIGS. 6 and 7, in an alternative embodiment the peak currents may be spread further in time by skewing the local clock signals inside the storage elements, for example by using delay elements as as shown in FIG. 5.

Figure 8:
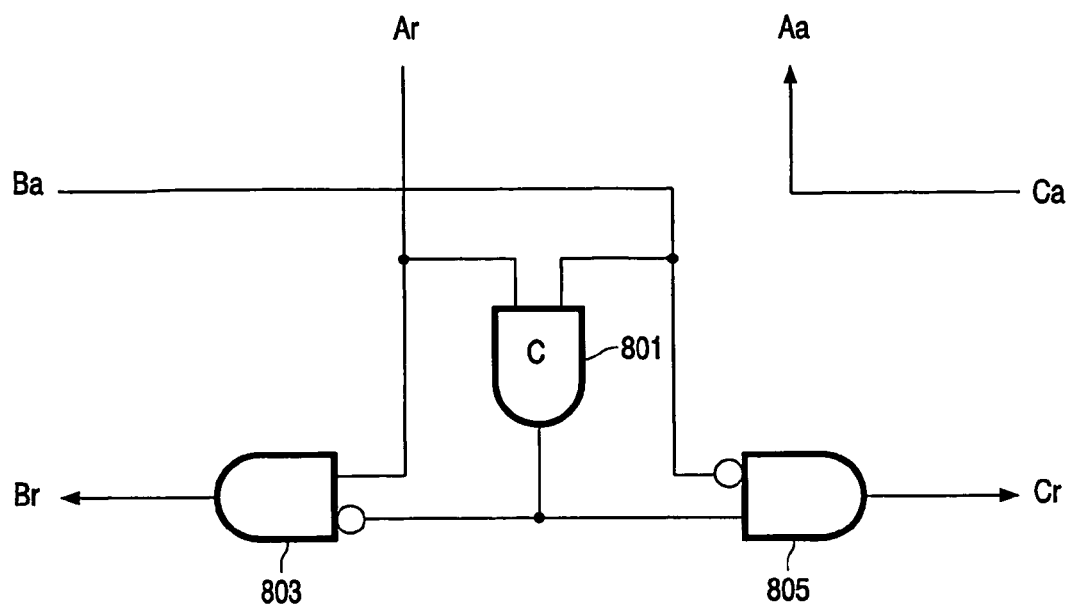
FIG. 8 shows an embodiment of a handshake component for sequential activation of two handshake channels.

FIG. 8 shows an embodiment of a handshake component for sequential activation of two handshake channels. Two separate connections are used for request and acknowledge, respectively, in combination with a four-phase protocol. The handshake component comprises three ports: a passive port A via which it is activated, and active ports B and C that are controlled by the handshake component. Port A comprises a connection for request signal Ar and a connection for acknowledge signal Aa. Port B comprises a connection for request signal Br and a connection for acknowledge signal Ba. Port C comprises a connection for request signal Cr and a connection for acknowledge signal Ca. The connections are coupled to a C-element 801, and to two AND gates 803 and 805. AND gate 803 has an inverter on its input port for receiving the signal from C-element 801, and AND gate 805 has an inverter on its input port for receiving the signal Ba. The C-element 801 can be implemented by both a symmetric or an asymmetric C-element. The connections for signal Ca and signal Aa are connected to each other. The handshake component is organized around C-element 801. When a symmetrical C-element is used, its output goes high when both inputs Ar and Ba are high, goes low when both inputs Ar and Ba are low, and is state-holding otherwise, i.e. when Ar and Ba differ. Preferably, an asymmetric C-element is used, whose output goes high when both inputs Ar and Ba are high, goes low when input Ar is low, and is state-holding otherwise, i.e. when Ar is high and Ba is low. The behaviour of the handshake component is specified by,

*([Ar];Br↑;[Ba];Br↓;[¬Ba];Cr↑;[Ca];Aa↑;[¬Ar];
Cr↓;[¬Ca];Aa↓)

where: ↑ refers to a signal going high, ↓ refers to a signal going low, [] denotes "wait until the enclosed condition holds", where the condition typically depends on inputs of the component that is specified, ¬ refers to Boolean negation, ; distinguishes between two consecutive actions, and * refers to repetition of the complete handshake communication, which notation is borrowed from A. J. Martin, Compiling communicating processes into delay-insensitive VLSI circuits, Distributed Computing, 1(4), 226-234, 1986.

After a request on channel A a complete four-phase handshake on active port B is performed, followed by a complete four-phase handshake on active port C. The return-to-zero of request signal Ar is acknowledged by making acknowledge signal Aa low.

Figure 9:
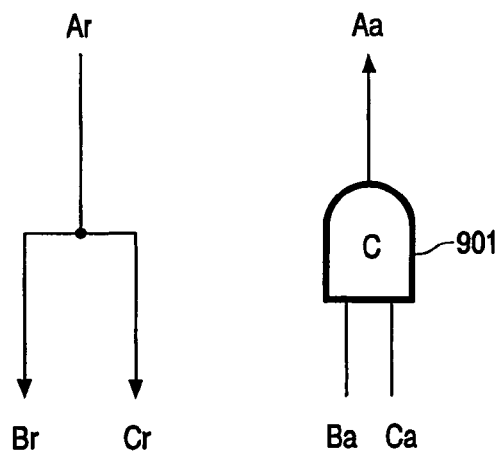
FIG. 9 shows an embodiment of a handshake component for parallel activation of two handshake channels.

An embodiment of a handshake component for parallel activation of two handshake channels is shown in FIG. 9. Two separate connections are used for request and acknowledge, respectively, in combination with a four-phase protocol. The handshake component comprises three ports: a passive port A via which it is activated, and active ports B and C that it controls. Port A comprises a connection for request signal Ar and a connection for acknowledge signal Aa. Port B comprises a connection for request signal Br and a connection for acknowledge signal Ba. Port C comprises a connection for request signal Cr and a connection for acknowledge signal Ca. The connections for the acknowledge signals Ba and Ca are connected to the input ports of C-element 901. The connection for the acknowledge signal Aa is connected to the output port of C-element 901. The C-element 901 is a symmetric C-element, whose output goes high when both inputs Ba and Ca are high, goes low when both inputs Ba and Ca are low, and is state-holding otherwise. The connection for the request signal Ar is coupled to the connections for the request signals Br and Cr. The behaviour of the handshake component is specified by,

*([Ar];Br↑||Cr↑;[Ba^Ca];Aa↑;[¬Ar];Br↓||Cr↓; [¬Ba^¬Ca];Aa↓)

where: ↑ refers to a signal going high, ↓ refers to a signal going low, [] denotes "wait until the enclosed condition holds", where the condition typically depends on inputs of the componet that is specified, ¬ refers to Boolean negation, || refers to two actions carried out in parallel, ^ refers to logical AND, ; distinguishes between two consecutive actions, and * refers to repetition of the complete handshake communication, which notation is borrowed from A. J. Martin, Compiling communicating processes into delay-insensitive VLSI circuits, Distributed Computing, 1(4), 226-234, 1986.

After a request on channel A, channels B and C are activated simultaneously and on both these channels a complete four-phase handshake is performed in parallel. The acknowledgements of channels B and C are synchronized. The return-to-zero of request signal Ar is acknowledged by making acknowledge signal Aa low.

Embodiments for the handshake components SEQ and PAR are based on the handshake components shown in FIG. 8 and FIG. 9, respectively. Alternative embodiments for the handshake components PAR and SEQ can be applied as well, as known by the person skilled in the art. One may for instance vary the number of handshake ports per component, and use a multi-channel handshake component SEQ or PAR, as shown in FIGS. 6 and 7. Another alternative is the choice of the handshake protocol for each handshake channel. The embodiments of FIGS. 6 and 7 show a four-phase implementation, based on the so-called broad four-phase handshake protocol for each channel. Naturally, a different protocol may be selected per channel. Single wire, two phase, and early, broad and late four-phase protocols could be used, for example.

Another embodiment of an electronic circuit according to the invention is a pipelined circuit, where the logic circuit is split into sections and successive sections are coupled via storage elements. A clock signal causes results produced by the sections to be loaded into the storage elements at the end of the sections at the end of a clock period. During the next clock period the results of each section is supplied to the next section. Such pipelined circuits exhibit power consumption peaks around the clock edges, for loading data elements into the storage elements, and subsequently developing new results. In a previous patent application EP03103399.6 by the applicant, attorney's docket PHNL031096, a pipelined circuit is proposed where the sections are activated in a counter-flow fashion, that is, starting at the output section of the pipeline and working towards the input section of the pipeline. This timing architecture reduces the peaks in power consumption to that caused by the activation of a single section. The number of registers per storage element may vary, in the sense that a pipelined circuit may have sections with significantly more registers than the other sections. In case the maximum of the power consumption peak is still too high, though all sections are activated sequentially, the storage element of such a section can be split into two or more parts that are activated sequentially. In this way, the peak in the power consumption can be further reduced until it is below a value that is still acceptable. The sequential activation of two or more parts of a single section, in combination with the sequential activation of different sections can be used both for clocked as well as for self-timed circuits.

A further embodiment of an electronic circuit according to the invention comprises a adder, for example 128 bit wide, for which both the operands and the results are latched. An access to such an adder would then typically look like:

Latch (Operand1)||Latch (Operand2); Latch (Result)

The last operation in this sequence latches only 128 bits in parallel, but the operands, when latched in parallel involve a double load, that is, 256 bits. If this cumulative load cannot be afforded, but a load of 128 bits can, then a sequential activation could be considered:

Latch (Operand1); Latch (Operand2); Latch (Result)

A disadvantage of the sequential latching of the two operands is that the underlying adder then evaluates twice, and in principle could have two complete carry ripples. The sequential update of the operands thus induces power consumption peaks in the adder. This can be circumvented, at least partly, by the following scheme:

| | | |
|---|---|---|
| Latch(Operand1.low) | || | Latch(Operand2.low) ; |
| Latch(Operand1.high) | || | Latch(Operand2.high) ; |
| Latch(Result) | | |

In which Operand_i.low and Operand_i.high refer to the low-order half and the high-order half of the operand bits, respectively. The peak in power consumption can be further reduced, if necessary, by performing three or more latches for the two operands in parallel, for storing the operand values. As a result, the peak in the power consumption can be controlled, such that it will be below a maximum allowable value. In the extreme case, by applying the above idea recursively, one may arrive at an implementation where the operands and results are activated bit-serially, and where the skew between bits is tuned towards the carry delay between two bits, so as to minimize not only the current peaks, but also the total energy consumption, by avoiding unnecessary transitions in the adder circuit.

An alternative further embodiment of an electronic circuit according to the invention is a pipelined circuit, for example a microcontroller, where the registers of each storage element are activated one-by-one. The resulting performance of the electronic circuit will be low, depending, amongst others, on the delay between the activation of two registers of a single storage element, and the number of registers of different storage elements that are activated in parallel. Such an embodiment is used to keep an electronic circuit running during a stand-by period. The peaks in power consumption will be extremely low, as well as the overall power consumption.

It should be noted that the above-mentioned embodiments illustrate rather than limit the invention, and that those skilled in the art will be able to design many alternative embodiments without departing from the scope of the appended claims. In the claims, any reference sign placed between parentheses shall not be construed as limiting the claim. The word "comprising" does not exclude the presence of elements or steps other than those listed in a claim. The word "a" or "an" preceding an element does not exclude the presence of a plurality of such elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. An electronic circuit comprising:
  a plurality of storage elements arranged for storing data elements,
  a plurality of processing elements arranged for processing the data elements stored in the plurality of storage elements; and
  a timing circuit arranged to determine a first set of points in time, in a first operating mode, at which respective storage elements of the plurality of storage elements load their data elements, the points in time of the first set of points in time being mutually different in order to meet a maximum allowable value of power consumption peaks, the timing circuit further arranged to determine a second set of points in time, in a second operating mode, at which respective storage elements of the plurality of storage elements load their data elements, the points in time of the second set of points in time being essentially identical, and wherein the timing circuit selects one of the first and second operating modes in response to a control signal.

2. An electronic circuit according to claim 1, the electronic circuit further comprising:
  a clock generator arranged to generate a periodic clock signal,
  delay elements arranged to generate points in time of the first set of points in time for respective ones of the storage elements to load their data elements by adding respective delays to the periodic clock signal, wherein the respective delays are mutually different, and the frequency of the clock generator is low enough in order to ensure data integrity during processing of the data elements.

3. An electronic circuit according to claim 1, further comprising a timing circuit arranged to determine the first set of points in time in a first operating mode, wherein the timing circuit is further arranged to determine a second set of points in time, in a second operating mode, at which respective storage elements of the plurality of storage elements load their data elements, wherein the respective points in time of the second set of points in time are essentially identical, and wherein the timing circuit is further arranged to select an operating mode depending on a control signal (CS).

4. An electronic circuit according to claim 1, wherein the timing circuit includes
  a first clock generator arranged to generate a first periodic clock signal that is used to determine the first set of points in time, and
  a second clock generator arranged to generate a second periodic clock signal that is used to determine the second set of points in time.

5. An electronic circuit according to claim 4, further comprising:
  delay elements arranged to generate points in time of the first set of points in time for respective ones of the storage elements to load their data elements by adding respective delays to the first periodic clock signal, wherein the respective delays are mutually different.

6. An electronic circuit according to claim 1, wherein the timing circuit includes a clock generator arranged to generate a periodic clock signal that is used to determine either the first set of points in time or the second set of points in time, depending on the control signal.

7. An electronic circuit according to claim 1, wherein the electronic circuit is a self-timed circuit, further comprising:
  a handshake channel arranged for communication between storage elements of the plurality of storage elements and processing elements of the plurality of processing elements, and
  delay elements arranged to generate points in time of the first set of points in time for respective ones of the storage elements by adding respective delays to a request signal for loading of the data elements, wherein the respective delays are mutually different.

8. An electronic circuit according to claim 1, wherein the electronic circuit is a self-timed circuit, further comprising:
  handshake channels arranged for communication between storage elements of the plurality of storage elements and processing elements of the plurality of processing elements,
  a first handshake component arranged to receive a request signal, in the first operating mode, for loading of data elements and in response thereto to generate request signals for respective ones of the storage elements of the plurality of storage elements for loading of data elements at respective points in time of the first set of points in time.

9. An electronic circuit according to claim 8, further comprising:
  a second handshake component arranged to receive a request signal, in the second operating made, for loading of data elements and in response thereto to generate request signals for respective ones of the storage elements of the plurality of storage elements for loading of data elements, wherein the request signals in the second mode of operation are generated at essentially identical points in time.

10. A method of processing data elements, the method comprising:
   determining a first set of points in time, in a first operating mode, at which respective storage elements of a plurality of storage elements load their data elements, the points in time of the first set of points in time being mutually different in order to meet a maximum allowable value of power consumption peaks;
   determining a second set of points in time, in a second operating mode, at which respective storage elements of the plurality of storage elements load their data elements, the points in time of the second set of points in time being essentially identical;
   selecting one of the first and second operating modes in response to a control signal; and
   generating output data elements each-by performing respective logic operation on data elements loaded from the respective storage elements.

11. A method of processing data elements according to claim 10, further comprising:
   generating a first periodic clock signal that is used to determine the first set of points in time, and
   generating a second periodic clock signal that is used to determine the second set of points in time.

12. A method of processing data elements according to claim 10, further comprising:
   generating a periodic clock signal that is used to determine one of the first set of points in time and the second set of points in time in response to the control signal.

13. An electronic circuit comprising:
   a plurality of storage elements arranged for storing data elements,
   a plurality of processing elements arranged for processing the data elements stored in the plurality or storage elements;
   a timing circuit arranged to determine a first set of points in time, in a first operating mode, at which respective storage elements of the plurality of storage elements load their data elements, the points in time of the first sot of points in time being mutually different in order to meet a maximum allowable value of power consumption peaks, the timing circuit further arranged to determine a second set of points in time, in a second operating mode, at which respective storage elements of the plurality of storage elements load their data elements, the points in time of the second set of points in time being essentially identical;
   a first clock generator arranged to generate a first periodic clock signal that is used to determine the first set of points in time; and
   a second clock generator arranged to generate a second periodic clock signal that is used to determine the second set of points in time, and
   wherein the timing circuit selects one of the first and second operating modes in response to a control signal.

14. An electronic circuit according to claim 13, further comprising:
   delay elements arranged to generate points in time of the first set of points in time for respective ones of the storage elements to load their data elements by adding respective delays to the first periodic clock signal, wherein the respective delays are mutually different.

* * * * *